(12) United States Patent
Kimura et al.

(10) Patent No.: US 7,909,087 B2
(45) Date of Patent: Mar. 22, 2011

(54) HEAT EXCHANGER

(75) Inventors: Naoki Kimura, Tokyo (JP); Akira Hideno, Tokyo (JP)

(73) Assignee: Furukawa-Sky Aluminum Corp., Tokyo (JP)

( * ) Notice: Subject to any disclaimer, the term of this patent is extended or adjusted under 35 U.S.C. 154(b) by 889 days.

(21) Appl. No.: 11/780,218

(22) Filed: Jul. 19, 2007

(65) Prior Publication Data

US 2008/0023189 A1 Jan. 31, 2008

(30) Foreign Application Priority Data

Jul. 26, 2006 (JP) ................................. 2006-203212
Jan. 26, 2007 (JP) ................................. 2007-015783
Jun. 18, 2007 (JP) ................................. 2007-159687

(51) Int. Cl.
*F28F 7/00* (2006.01)
(52) U.S. Cl. ....................... 165/80.3; 361/697
(58) Field of Classification Search ................. 165/80.3, 165/185; 361/697
See application file for complete search history.

(56) References Cited

U.S. PATENT DOCUMENTS

| | | | | |
|---|---|---|---|---|
| 4,953,634 A | * | 9/1990 | Nelson et al. | ................. 165/147 |
| 5,150,278 A | | 9/1992 | Lynes et al. | |
| 5,694,295 A | * | 12/1997 | Mochizuki et al. | ........... 361/699 |
| 6,364,009 B1 | * | 4/2002 | MacManus et al. | .......... 165/185 |
| 6,935,419 B2 | * | 8/2005 | Malone et al. | ................. 165/185 |
| 2002/0139515 A1 | * | 10/2002 | Azar | ............................. 165/80.3 |
| 2004/0244947 A1 | * | 12/2004 | Chen | ............................ 165/80.3 |

FOREIGN PATENT DOCUMENTS

| | | |
|---|---|---|
| JP | 7-15160 | 1/1995 |
| JP | 7-329740 | 12/1995 |
| JP | 10-12517 | 1/1998 |
| JP | 2001-345585 | 12/2001 |

* cited by examiner

*Primary Examiner* — Teresa J Walberg
(74) *Attorney, Agent, or Firm* — Oblon, Spivak, McClelland, Maier & Neustadt, L.L.P.

(57) ABSTRACT

A heat exchanger including a base plate portion with at least one heat generating component thermally connected thereto; at least one fin portion comprising a plurality of fins thermally connected to said base plate portion, arranged in parallel at a prescribed angle along a longitudinal direction of said base plate portion; an inlet portion through which a cooling fluid is introduced to each of said at least one fin portion; a baffle plate portion and a partition plate portion guiding said cooling fluid so that the cooling fluid is decelerated to be uniformly flown through fins in said at least one fin portion; and an outlet portion to evacuate the cooling fluid.

16 Claims, 10 Drawing Sheets

HEAT EXCHANGER

BACKGROUND OF THE INVENTION

1. Field of the Invention

The present invention relates to a heat exchanger excellent in heat dissipating efficiency, in particular a heat exchanger including a base plate and heat dissipating fins to improve heat exchange between a cooling air and the heat dissipating fins by reducing a flow rate of the cooling air flowing through the heat dissipating fins.

2. Related Art

Because of the increased heat generating amount and the heat generating density, a high efficient heat exchanger excellent in heat dissipating efficiency is desired. A heat exchanger made of aluminum extruded material with a low manufacturing cost has been used. Since the base plate and the heat dissipating fins are integrally formed in the heat exchanger made of the extruded material, the manufacturing thereof is easy. In addition, the base plate and the heat dissipating fins may be separately manufactured, and the heat dissipating fins are jointed on one surface of the base plate to form the heat exchanger.

FIG. 6 is an oblique perspective view of a conventional heat exchanger. As depicted in FIG. 6, the conventional heat exchanger 100 includes a base plate 102, to one surface of which a heat generating component is thermally connected, and a plurality of plate-shaped heat dissipating fins 103 which are thermally connected to the other surface of the base plate.

A cooling air is blown by a fan or the like along a longitudinal direction of the base plate from one end thereof as represented by the numeral reference 108 in the conventional heat exchanger 100 to dissipate the heat transferred from the heat generating component through the base plate to the plate shaped heat dissipating fins into the atmosphere. In case that a plurality of heat generating components are thermally connected to the base plate along the longitudinal direction thereof, a large amount of the cooling air is blown into the plate shaped heat dissipating fins from one end of the base plate to dissipate the heat of the plurality of heat generating components (refer to Japanese Patent Application Publication No. 7-15160).

In general, the amount of the cooling air to be supplied is determined in each of the apparatus in the heat exchanger in which the plurality of plate shaped heat dissipating fins are thermally connected to the one surface of the base plate as described above. When the length of the heat dissipating fin is long and the distance between adjacent fins of the plate shaped heat dissipating fins is small, the front portion of the heat dissipating fin in the air flowing direction is hit by a cool air while the back portion of the same heat dissipating fin in the air flowing direction is not hit by the cool air. On the other hand, when the distance between the adjacent fins of the plate shaped heat dissipating fins is set to be large, and a large amount of cooling air is blown in the fins at a high speed, expecting high cooling efficiency, the cooling air passes in the central portion between the fins, resulting in that the heat exchange between the cooling air and the fins is not effectively performed. Thus, the conventional heat exchanger has a problem in which the heat of the plurality of heat generating components arranged in depth along the air flowing direction, in particular the heat of the heat generating component arranged in the leeward side is not effectively cooled.

An object of the invention is therefore to provide a heat exchanger excellent in heat dissipating efficiency in which the heat of the plurality of the heat generating components arranged in depth along the air flowing direction can be effectively cooled.

SUMMARY OF THE INVENTION

In order to solve the above-mentioned conventional problem, the inventors have intensively studied. As a result, it was found that when the flow rate of the cooling air flowing through the plate shaped fins is reduced so that temperature boundary layers are to be overlapped, the temperature at the surface of the plate shaped fin of the heat exchanger can be made to be close to the temperature at the outlet side of the fin. When the cooling air passes through the fins, the temperature of a portion of the cooling air is raised by the heat transferred from the fin and then a boundary is formed between the portion of the cooling air with the temperature thereof raised and a portion of the cooling air without affected by the heat. This boundary is called as the above-mentioned temperature boundary layer.

More specifically, it was found that even though the high speed cooling air is blown into the plate shaped fins, a considerable portion of the cooling air only passes through the plate shaped fins without performing the heat exchange, thus, it is important to appropriately control the relation between the distance between the adjacent fins of the plate shaped fins, a length of the plate shaped fin, and a flow rate of the cooling air flowing through the plate shaped fins. The present invention is made on the basis of the above result of the study.

A first embodiment of the heat exchanger of the invention is a heat exchanger including a base plate portion with at least one heat generating component thermally connected thereto; at least one fin portion comprising a plurality of fins thermally connected to said base plate portion, arranged in parallel at a prescribed angle along a longitudinal direction of said base plate portion; an inlet portion through which a cooling fluid is introduced to each of said at least one fin portion; a baffle plate portion and a partition plate portion guiding said cooling fluid so that the cooling fluid is decelerated to be uniformly flown through fins in said at least one fin portion; and an outlet portion to evacuate the cooling fluid.

A second embodiment of the heat exchanger of the invention is a heat exchanger including at least one fin portion comprising a plurality of fins; an inlet portion introducing a cooling fluid to each of said at least one fin portion; a baffle plate and a partition plate guiding said cooling fluid so that the cooling fluid is decelerated to be uniformly flown through fins in said at least one fin portion; and an outlet portion to evacuate the cooling fluid.

A third embodiment of the heat exchanger of the invention is a heat exchanger including a base plate portion with at least one heat generating component thermally connected thereto; a fin group with at least two fin portions arranged so as to form a structure in which a flow rate of cooling fluid is decelerated, each of the fin portion comprising a plurality of fins thermally connected to said base plate, arranged in parallel at a prescribed angle along a longitudinal direction of said base plate; an inlet portion through which the cooling fluid is introduced to each of said at least two fin portions; and an outlet portion to evacuate the cooling fluid, said fin group being arranged so that the cooling fluid is guided to be decelerated to be uniformly flown through each of the fins in the respective at least two fin portions.

The fourth embodiment of the heat exchanger of the invention is a heat exchanger in which the structure comprising the fin group arranged to form a reverse V-shape in which space between the fin portions each comprising a plurality of fins placed in parallel becomes narrower from the inlet portion to the outlet portion.

The fifth embodiment of the heat exchanger of the invention is a heat exchanger in which the fin group is arranged to form a reverse V-shape in which space between the fin portions each comprising a plurality of fins placed in parallel becomes narrower from the inlet portion to the outlet portion, and there is included at least one other pair of fins arranged along the longitudinal direction of the base plate portion at the outlet portion.

The sixth embodiment of the heat exchanger of the invention is a heat exchanger in which said at least one fin portion comprises one fin portion, said partition plate portion is arranged both end portions of said fin portion, and said baffle plate portion is arranged in a vicinity of respective near end portion and far end portion of the fins.

The seventh embodiment of the heat exchanger of the invention is a heat exchanger in which said at least one fin portion comprises a plurality of fin portions arranged along a width direction of said base plate portion, said partition plate portion is arranged between the fin portions and both outer side-end portions, and said baffle plate portion is arranged in a vicinity of respective near end portion and far end portion of the fins.

The eighth embodiment of the heat exchanger of the invention is a heat exchanger in which the cooling fluid introduced through the inlet portion flows along a passage formed between one end portions of the plurality of fins and the partition plate portion, and guided by both of the baffle plate portion and the partition plate portion to be decelerated so that the cooling fluid flows through the fins and along a passage formed between other end portions of the plurality of fins and the partition plate portion, and flows out of the outlet portion.

The ninth embodiment of the heat exchanger of the invention is a heat exchanger in which a distance between the adjacent fins, a fin length and a flow rate of the cooling fluid through fins are to be set considering a manner in which a temperature difference between a temperature on a surface of the fin to which a heat of the heat generating component is transferred and a temperature of the cooling fluid at the outlet portion becomes small.

The tenth embodiment of the heat exchanger of the invention is a heat exchanger in which a speed of the cooling fluid flowing through the fins is reduced so that respective temperature boundary layers of adjacent fins formed by the cooling fluid flowing through the fins are overlapped.

The eleventh embodiment of the heat exchanger of the invention is a heat exchanger in which a following equation is satisfied:

$$d \leq 9.4\sqrt{(L/v)} \times 3$$

where, d (mm) is a distance between the adjacent fins, L (mm) is a fin length, and v (m/s) is a flow rate of the cooling fluid flowing through fins.

The twelfth embodiment of the heat exchanger of the invention is a heat exchanger in which a following equation is satisfied:

$$d \leq 9.4\sqrt{(L/v)} \times 2$$

where, d (mm) is a distance between the adjacent fins, L (mm) is a fin length, and v (m/s) is a flow rate of the cooling fluid flowing through fins.

The thirteenth embodiment of the heat exchanger of the invention is a heat exchanger in which a following equation is satisfied:

$$d \leq 9.4\sqrt{(L/v)}$$

where, d (mm) is a distance between the adjacent fins, L (mm) is a fin length, and v (m/s) is a flow rate of the cooling fluid flowing through fins.

The fourteenth embodiment of the heat exchanger of the invention is a heat exchanger in which a flow volume of the cooling fluid flowing in each fin portion of the plurality of fin portions and/or a flow volume of the cooling fluid flowing through fins is different from each other.

The fifteenth embodiment of the heat exchanger of the invention is a heat exchanger in which said cooling fluid comprises a cooling air, and said heat exchanger comprises a naturally-cooled exchanger.

The sixteenth embodiment of the heat exchanger of the invention is a heat exchanger in which said cooling fluid comprises a cooling water, and said heat exchanger comprises a water-cooled exchanger.

DETAILED DESCRIPTION

Embodiments of the heat exchanger of the invention are described with reference to the drawings.

One of the embodiments of the heat exchanger of the invention is an heat exchanger including a base plate portion with at least one heat generating component thermally connected thereto; at least one fin portion comprising a plurality of fins thermally connected to said base plate portion, arranged in parallel at a prescribed angle along a longitudinal direction of said base plate portion; an inlet portion through which a cooling fluid is introduced to each of said at least one fin portion; a baffle plate portion and a partition plate portion guiding said cooling fluid so that the cooling fluid is decelerated to be uniformly flown through fins in said at least one fin portion; and an outlet portion to evacuate the cooling fluid.

For example, in one embodiment of the heat exchanger of the invention, at least one fin portion comprises one fin portion, a partition plate portion is arranged in both side end portions of the fin portion, and a baffle plate portion is arranged in the vicinity of the respective nearest and farthest plate shaped fins in the longitudinal direction of the fin portion.

Figure 1:
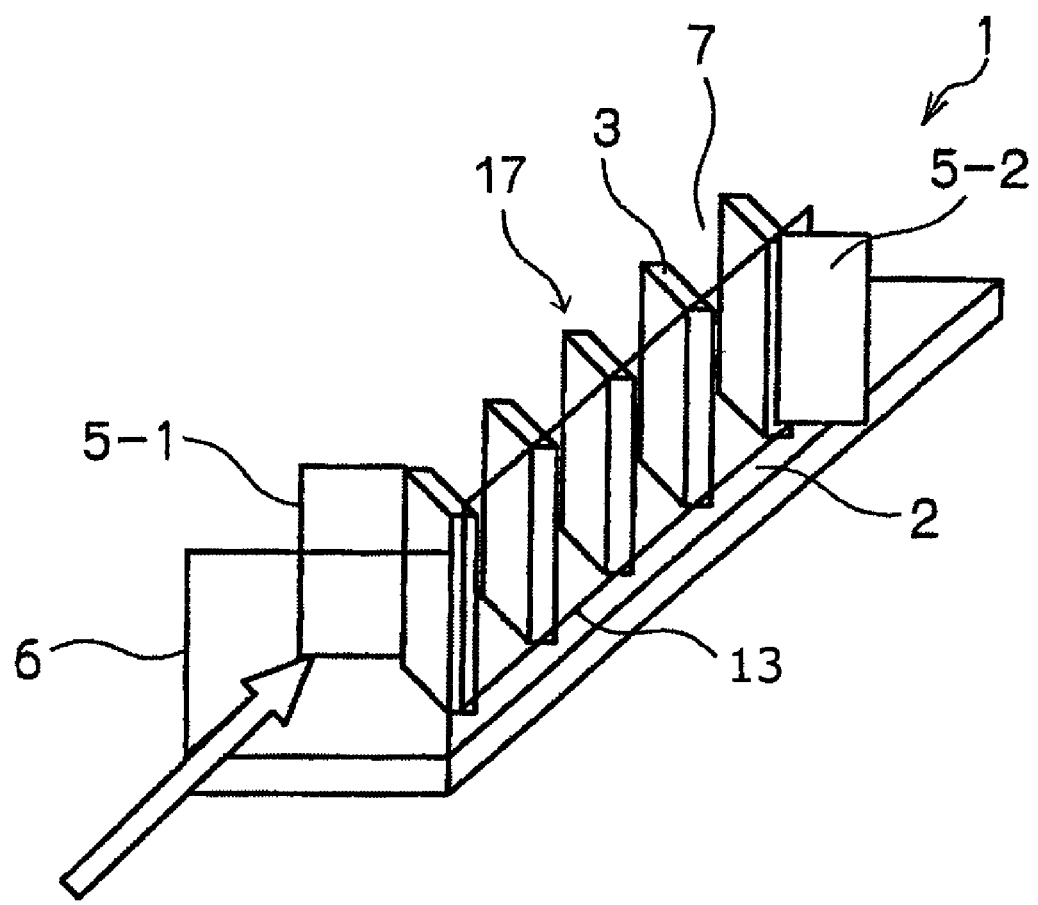
FIG. 1 is a partial oblique perspective view to explain one embodiment of the heat exchanger of the invention.
Figure 8:
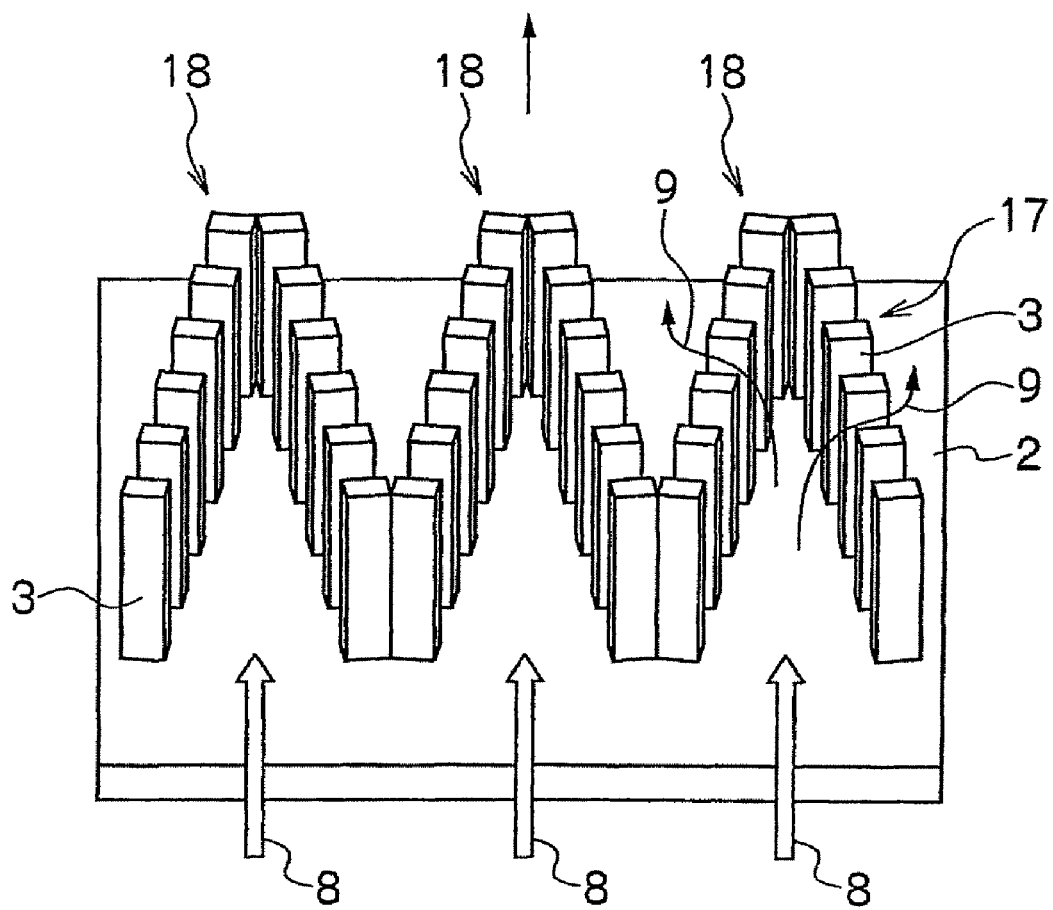
FIG. 8 is a partial oblique perspective view to explain one of the other embodiments of the heat exchanger of the invention.

A plate shaped fin, a fin portion and a fin group used in the present invention are defined as follows: each of the plate shaped fins is depicted in FIG. 1 and represented by the numeral reference 3. The fin portion comprises a whole of the plurality of the plate shaped fins 3 arranged in line, as depicted in FIG. 1. The fin group comprises a two fin portions 17 arranged in a reverse V-shape, as depicted in FIG. 8 and represented by the numeral reference 18.

FIG. 1 is a partial oblique perspective view to explain one embodiment of the heat exchanger of the invention. As depicted in FIG. 1, the heat exchanger includes a base plate portion 2 with a heat generating component (not shown) thermally connected to the back side thereof, a fin portion 13 comprising a plurality of fins 3 thermally connected to the surface of the base plate portion 2, arranged in parallel at a prescribed angle along a longitudinal direction on the base plate portion 2, an inlet portion 6 through which a cooling fluid (for example, cooling air) is introduced into the fin portion 13, a baffle plate portion 5-1, 5-2 and a partition plate portion (not shown) guiding the cooling air so that the cooling air is decelerated to be uniformly flown through fins in the fin portion 13, and an outlet portion 7 to evacuate the cooling air. As depicted in FIG. 1, a high flow rate of the cooling air is blown through the inlet portion 6 (i.e., apparent inlet portion), and then a low flow rate of the cooling air is blown through the fins 3 (i.e., substantial inlet portion).

Figure 2:
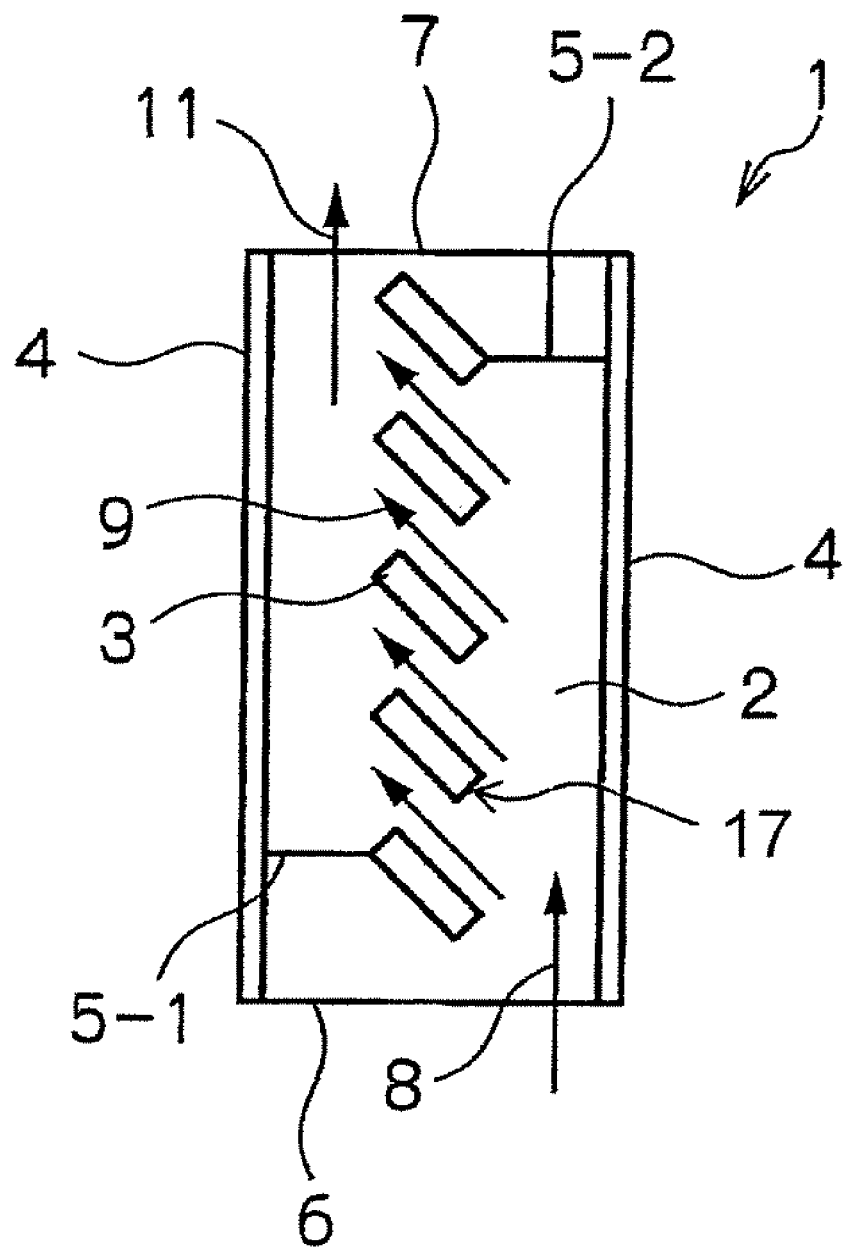
FIG. 2 is a plan view to explain the heat exchanger as depicted in FIG. 1.

FIG. 2 is a plan view to explain the heat exchanger as depicted in FIG. 1. As depicted in FIG. 2, a plurality of plate shaped fins 3 are arranged on the base plate portion 2 in parallel at a prescribed angle along a longitudinal direction thereof. More specifically, the fins are arranged with a prescribed distance therebetween. Although not depicted in FIG. 1 for explaining the substantial inlet portion, the partition plate portion 4 is arranged in the respective side end portions in the longitudinal direction of the base plate portion 2. The baffle plate portion 5-1, 5-2 is arranged at the nearest plate shaped fin 3, and the farthest plate shaped fin 3, respectively.

The inlet portion 6 through which the cooling air is blown into and the outlet portion 7 through which the cooling air is evacuated are provided in the heat exchanger 1. A high flow rate of the cooling air 8 is blown through the inlet portion 6 into the heat exchanger 1. Since the baffle plate portion 5-1 is fixed to the nearest plate shaped fin 3 in the fin portion 13, the cooling air 8 is prevented from flowing by the baffle plate portion 5-1 and is caused to flow along the passage formed by the partition plate portion 4 and the side end portion of the fin portion 13, i.e., which is formed by the end portions of the plurality of plate shaped fins 3 arranged in parallel along the longitudinal direction of the base plate portion 2, as depicted in FIG. 2.

The above-mentioned high flow rate of the cooling air 8 hits the baffle plate portion 5-2 fixed to the farthest plate shaped fin 3, and is disturbed thereby. Thus disturbed flow of the cooling air 8 is guided by the baffle plate portion 5-2 and the partition plate portion 4 so that the flow changes the direction and is decelerated to flow through the plate shaped fins 3 as a low flow rate of the cooling air 9. The low flow rate of the cooling air passing through the plate shaped fins joins together in the passage formed by the partition plate portion 4 and the other side end portion of the fin portion 13, i.e., which is formed by the other end portions of the plurality of plate shaped fins 3 arranged in parallel along the longitudinal direction of the base plate portion 2, and is evacuated through the outlet portion 7 (represented by the numeral reference 11) to the outside of the heat exchanger, as depicted in FIG. 2.

Figure 4:
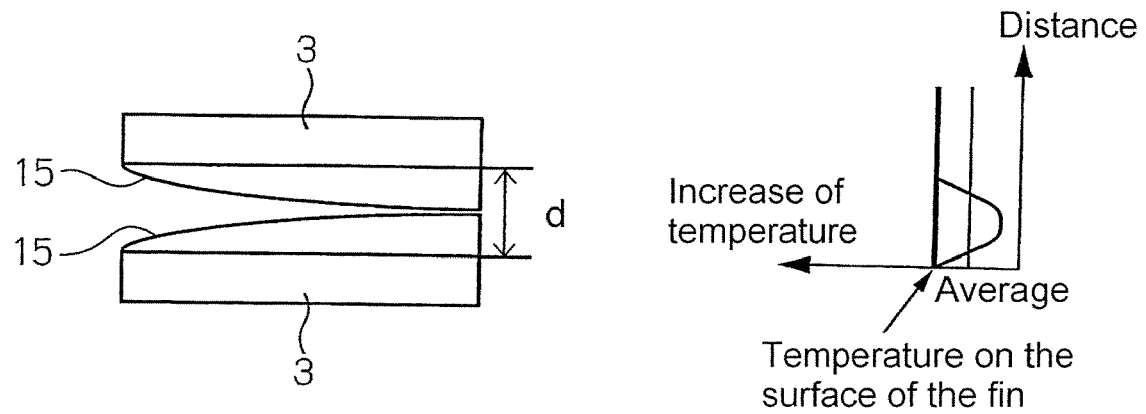
FIG. 4 is a partial sectional view to explain the heat dissipating characteristics of the heat exchanger of the invention.
Figure 5:
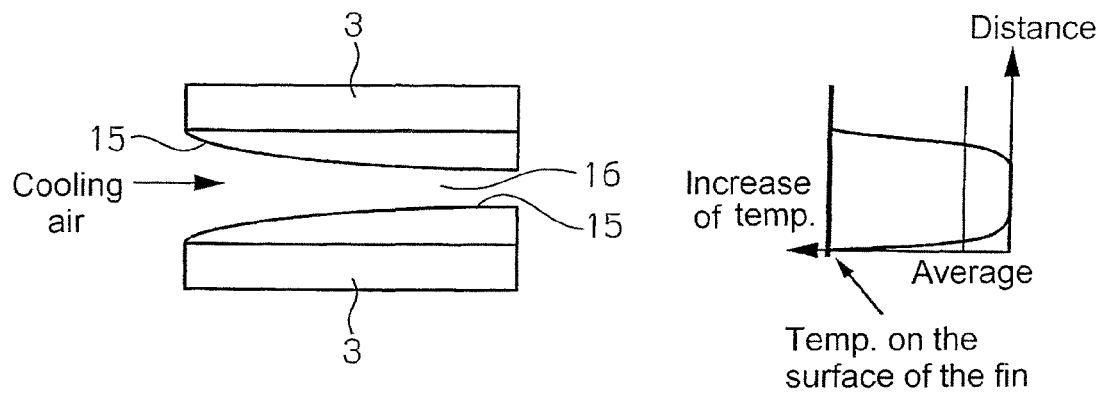
FIG. 5 is a partial sectional view to explain the heat dissipating characteristics of the conventional heat exchanger.
Figure 6:
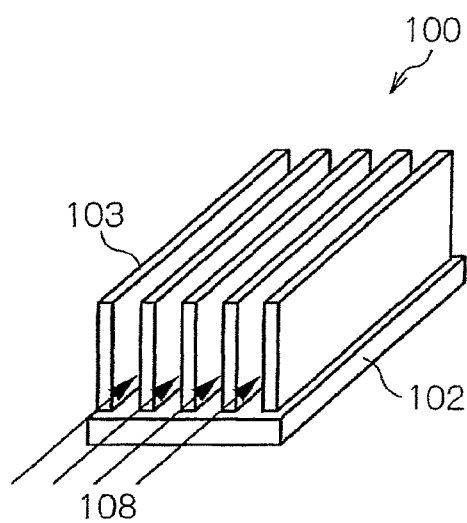
FIG. 6 is an oblique perspective view showing a conventional heat exchanger.

With reference to FIGS. 4 and 5, heat dissipating characteristics of the heat exchanger of the invention and the conventional heat exchanger is comparatively explained.

FIG. 4 is a partial sectional view to explain the heat dissipating characteristics of the heat exchanger of the invention. FIG. 5 is a partial sectional view to explain the heat dissipating characteristics of the conventional heat exchanger. In the respective left side portions of FIGS. 4 and 5, there are shown temperature boundary layers formed by the cooling air passing through the plate shaped fins. The above-mentioned temperature boundary layer is explained again. More specifically, when the cooling air passes through the fins, the temperature of a portion of the cooling air is raised by the heat transferred from the fin and then a boundary is formed between the portion of the cooling air with the temperature thereof raised and a portion of the cooling air without affected by the heat. This boundary is called as the above-mentioned temperature boundary layer. In the respective right side portions of FIGS. 4 and 5, there is shown the relation between the distance between the adjacent fins and the temperature distribution.

In the heat exchanger as depicted in FIG. 5, the spacing between the plate shaped fins (i.e., distance between the adjacent fins) is so large that the high flow rate of the cooling air sweeps past without performing heat exchange. More specifically, there exists between the temperature boundary layers 15, 15 a space for air flowing which has nothing to do with heat exchange. Thus, the temperature on the surface of the fins is high, while the temperature in the space for air flowing which has nothing to do with heat exchange remains as cool as that of the cooling air. As described above, even if the high flow rate of the cooling air is blown into the plate shaped fins, there occurs the situation in which considerable portions of the cooling air simply sweep past between the fins without being involved in the heat exchange (refer to the numeral reference 16, in FIG. 5).

As shown in the right side portion of FIG. 5, the temperatures on the surfaces of the adjacent plate shaped fins become high, and on the other hand, the temperature in the central portion between the adjacent fins does not rise at all. More specifically, the temperature difference in the cooling air becomes very large. Thus, it is clear that even if the high flow rate of the cooling air is blown into the plate shaped fins, the temperature on the surfaces of the fins is not lowered, resulting in very inefficient heat dissipation.

On the contrary, in the heat exchanger as depicted in FIG. 4, the high flow rate of the cooling air is not blown in the fins. The flow volume of the cooling air flowing through the plate shaped fins 3 is reduced so that the temperature boundary layers are overlapped. This may causes the temperature on the surfaces of the plate shaped fins of the heat exchanger to be close to the temperature of the plate shaped fin arranged at the outlet portion.

More specifically, as shown in the right side in FIG. 4, the temperature on the surface of the plate shaped fins is lowered, and in addition, the temperature in the central portion between the fins rises. Thus, the temperature difference between the surface of the plate shaped fin and the central portion between the fins becomes small. The temperature on the surfaces of the fins is lowered, resulting in excellent heat dissipating efficiency.

It is necessary to appropriately define the relation between the distance between the adjacent fins, the length of the fin, and the flow rate of the cooling air flowing through the fins in the heat exchanger excellent in the heat dissipating efficiency as depicted in FIG. 4.

The distance d (mm) between the adjacent fins of the plate shaped fins is derived from the condition under which the temperature boundary layers are overlapped (i.e., obtaining enough thickness of the temperature boundary layers) as depicted in FIG. 4, as follows:

$$d=2\sqrt{((22\times10^{-6})(L/v))}=9.4\times10^{-3}\sqrt{(L/v)}$$

therefore, $d=9.4\sqrt{(L/v)}$ where, L (m) is the length of the fin, v (m/s) is the flow rate of the cooling air flowing through the fins.

Thus, $d \leq 9.4\sqrt{(L/v)} \times 3$ is to be satisfied in the present invention. Preferably, $d \leq 9.4\sqrt{(L/v)} \times 2$ is to be satisfied. More preferably, $d \leq 9.4\sqrt{(L/v)}$ is to be satisfied. The essence of the present invention lies in the appropriate defining the shape of the fin, and the flow rate. In order to simplify the explanation, the flat plate fin such as the fin having a flat surface is exemplified. However, the fin in the present invention is not limited to the flat plate fin. More specifically, fins having a grid structure, a knurling fin (i.e., fin with recessed portion and protruding portion formed on the surface thereof), pin fins and the fin having wave portion at the downwind or windward side may be used, and the same effect can be obtained thereby.

The U-shaped curved lines as depicted in FIGS. 4 and 5 are described in detail hereunder.

The relation between the temperature of the cooling air and the temperature of the fin is expressed as follows:

$$T(x,t)=T0 \times erfc(z), z=y/2/\sqrt{(a'x/v)}$$

where, x is a length from the inlet of the fins, y is a distance from the surface of the fin, T(x,t) is the temperature of the cooling air, T0 is the temperature of the fin, a' is a thermal diffusivity coefficient, and z is a substantial distance from the fin.

Furthermore, the following equation is derived, considering affection from the adjacent fins:

$$T(x,t)=T0 \times (erfc(z)+erfc(z'))$$

$$z'=(d-y)/2/\sqrt{(a'x/v)}$$

where, d is the distance between the adjacent fins, other elements are the same as those in the previous equation. Thus, the U-shaped curved lines as depicted in FIGS. 4 and 5 may be obtained.

As described above, the substantial distance z from the fin may be considered as $z=y/2/\sqrt{(a'x/v)}$, thus the above value may be used as the parameter in the design of the heat exchanger.

Magnifications of an average temperature of the fins to the temperature of the cooling air at the outlet portion are as follows: when z=3, 2.65 times; when z=2, 1.79 times; when z=1, 1.12 times. Z<3 is preferable, z<2 is more preferable, and z<1 is most preferable.

Typically, for example, the distance between the adjacent fins is within a range from 0.5 mm to 1 mm, and the thickness of the fin is selected within a range from 1 mm to 2 mm, in addition, about 2 times of the distance between the adjacent fins. The length of the fin is within a range from 3 to 20 mm. However, the above values are merely shown as an example and are not limited to show a range within which the effect of the invention can be obtained.

Another embodiment of the heat exchanger of the invention includes a base plate portion with at least one heat generating component thermally connected to one surface thereof; a plurality of fin portions each comprising a plurality of fins thermally connected to the other surface of the base plate portion, arranged in parallel at a prescribed angle along a longitudinal direction of the base plate portion; an inlet portion through which a cooling air is introduced to each of the plurality of fin portions; baffle plate portions and partition plate portions guiding the cooling air so that the cooling air is decelerated to be uniformly flown through fins in the respective plurality of fin portions; and an outlet portion to evacuate the cooling air.

More specifically, a plurality of fin portions are arranged side by side in the width direction of the base plate portion. The partition plate portion is arranged between the adjacent fin portions, and the respective outer end portions of the base plate portion. The baffle plate portion is arranged in contact with the respective nearest fin and the farthest fin in the flowing direction of the cooling air in each of the fin portions.

Figure 3:
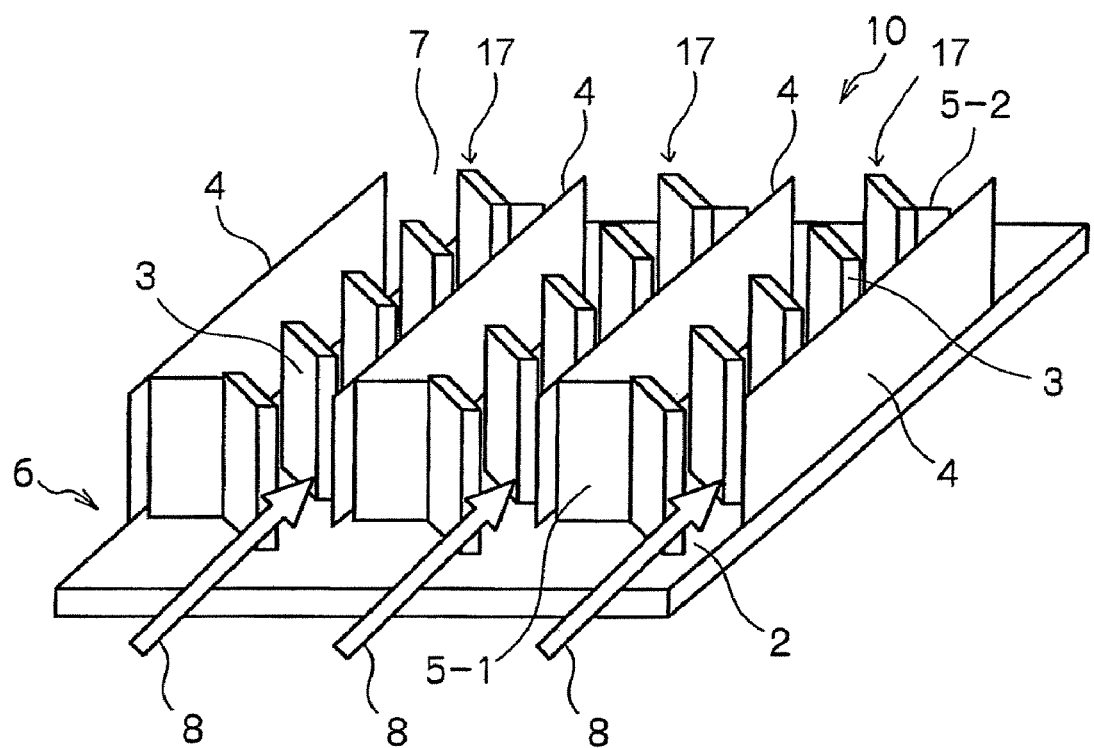
FIG. 3 is an oblique perspective view to explain one embodiment of the heat exchanger of the invention with a plurality of fin portions.

FIG. 3 is an oblique perspective view to explain other embodiment of the heat exchanger of the invention with a plurality of fin portions. As depicted in FIG. 3, the heat exchanger of this embodiment 10 comprises a plurality of the heat exchangers 1, which is explained with reference to FIG. 1, arranged side by side in the width direction of the base plate portion. The above-mentioned heat exchanger has a plurality of plate shaped fins arranged along the longitudinal direction on the base plate portion with the partition plate portion and the baffle plate portion enclosing the fins.

More specifically, the heat exchanger of the invention includes a base plate portion 2 with at least one heat generating component (not shown) thermally connected to one surface thereof, a plurality of fin portions 13 each comprising a plurality of plate shaped fins 3 thermally connected to the other surface of the base plate portion 2, arranged in parallel at a prescribed angle along a longitudinal direction of the base plate portion 2; an inlet portion 6 through which a cooling air is introduced to each of the plurality of fin portions 13, baffle plate portions 5-1, 5-2 and partition plate portions 4 guiding the cooling air so that the cooling air is decelerated to be uniformly flown through fins 3 in the respective plurality of fin portions 13, and an outlet portion 7 to evacuate the cooling air.

The plurality of fin portions 13 are arranged side by side in the width direction of the base plate portion 2. The partition plate portion 4 is arranged between the adjacent fin portions 13, and the respective outer end portions of the base plate portion 2. The baffle plate portion 5-1, 5-2 is arranged in contact with the respective nearest fin 3 and the farthest fin 3 in the flowing direction of the cooling air in each of the fin portions 13.

The heat exchanger 10 has a plurality of fin portions (i.e., heat dissipating member) arranged side by side in the width direction of the base plate portion, each having a plurality of plate shaped fins arranged in the space enclosed by the partition plate portion and the baffle plate portion along the longitudinal direction on the base plate portion. High flow rate of cooling air is blown into the respective fin portions though the inlet portion. Since the baffle plate portion 5-1 is fixed to the nearest plate shaped fin 3 in the fin portion 13, the cooling air 8 is prevented from flowing by the baffle plate portion 5-1 and is caused to flow along the passage formed by the partition plate portion 4 and the side end portion of the fin portion 13.

The above-mentioned high flow rate of the cooling air 8 hits the baffle plate portion 5-2 fixed to the farthest plate shaped fin 3, and is disturbed thereby. Thus disturbed flow of the cooling air 8 is guided by the baffle plate portion 5-2 and the partition plate portion 4 so that the flow changes the direction and is decelerated to flow through the plate shaped fins 3 as a low flow rate of the cooling air 9. The low flow rate of the cooling air passing through the plate shaped fins joins together in the passage formed by the partition plate portion 4 and the other side end portion of the fin portion 13, and is evacuated through the outlet portion 7 to the outside of the heat exchanger. Thus, the cooling air is blown through all the plate shaped fins arranged along the longitudinal direction of the base plate portion.

In this embodiment of the heat exchanger, as explained with reference to FIG. 4, the relation is appropriately defined between the distance between the adjacent fins, the length of the fin, and the flow rate of the cooling air flowing through the fins in the heat exchanger, thus excellent in the heat dissipating efficiency. More specifically, For the distance d (mm) between the adjacent fins of the plate shaped fins, $d \leq 9.4\sqrt{(L/v)} \times 3$ is to be satisfied, preferably, $d \leq 9.4\sqrt{(L/v)} \times 2$ is to be satisfied, and more preferably, $d \leq 9.4\sqrt{(L/v)}$ is to be satisfied, where L (m) is the length of the fin, v (m/s) is the flow rate of the cooling air.

When the embodiment of the heat exchanger as depicted in FIG. 3 is used, a plurality of heat generating components arranged in the longitudinal direction of the base plate portion can be effectively dissipated, in addition, a plurality of heat generating components arranged in the width direction of the base plate portion can be effectively dissipated. Thus, the heat generated from variously arranged heat generating components can be effectively dissipated and cooled, enabling the expanded application of the heat exchanger.

Figure 7A:
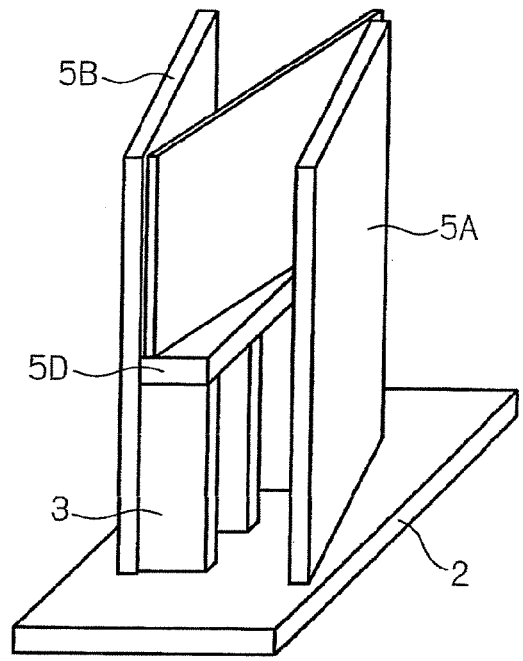
FIG. 7 is a partial oblique perspective view to explain one of the other embodiments of the heat exchanger of the invention.
Figure 7B:
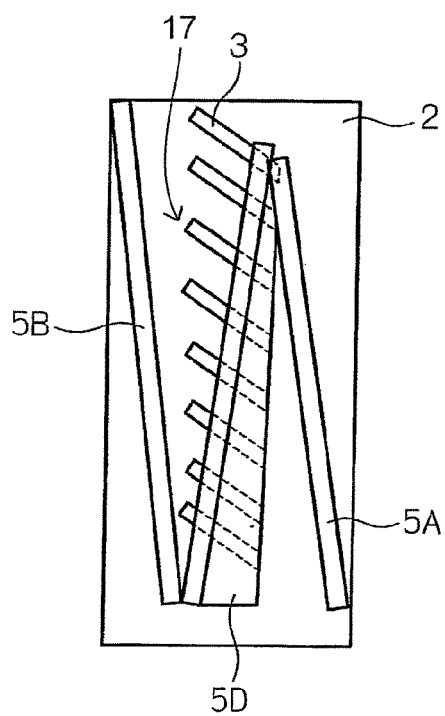

FIG. 7(*a*) is a partial oblique perspective view to explain one of the other embodiments of the heat exchanger of the invention. FIG. 7(*b*) is a plan view thereof. In this embodiment of the heat exchanger, the baffle plate 5A is arranged so that the distance between the baffle plate 5A and the plate shaped fin 3 becomes gradually narrower from the front side to the back side of the base plate portion. In addition, another baffle plate 5D is placed over the upper ends of the plate shaped fins so as to substantially cover the upper side of the fins. The cooling air is therefore guided by the baffle plate 5A to turn the flowing direction and to be decelerated, and then flows through the fins 3. The plate shaped fins 3 in the embodiment of the heat exchanger as depicted in FIG. 7(*a*) are arranged to be perpendicular to the flowing direction of the cooling air (i.e., direction from the front side to the back side of the base plate portion). The fins may be arranged to be inclined to the flowing direction of the cooling air as depicted in FIG. 7(*b*).

As depicted in FIGS. 7(*a*) and 7(*b*), since the baffle plate is placed over the upper ends of the plate shaped fins, the height of the fins can be designed to be shorter than the height of the inlet portion in the embodiment of the heat exchanger as depicted in FIG. 1 resulting in the improved fin efficiency to be favorable in heat characteristics.

Furthermore, in order to facilitate heat transfer, rod-like member may be placed in the vicinity of the fin, one or more slits may be formed in the fin, or the passage may be made to be crank-like (i.e., the shape connecting two L-like in succession).

FIG. 8 is a partial oblique perspective view to explain one of the other embodiments of the heat exchanger of the invention. As depicted in FIG. 8, a plurality of plate shaped fins 3 are arranged on the base plate portion at a prescribed interval along the longitudinal direction thereof to form the fin portion 17. The above-mentioned two fin portions 17 are combined as a pair and are arranged in a reverse V-shape to form a fin group 18. The reverse V-shape means that the space between the fin portions 17 becomes gradually narrower along the flowing of the high flow rate of the cooling air 8 from the inlet portion to the outlet portion. When the respective farthest fins 3 of the fin portions 17 are arranged so as to contact each other, the space between the adjacent fins is closed so that the flow of the cooling air is guided to a lateral direction. As depicted in FIG. 8, for example, when the nearest left side fin 3 of the fin group 18 comprising a pair of fin portions 17 is arranged so as to be contact with the nearest right side fin 3 of the adjacent fin group 18, the flow of the cooling air 8 may be guided into the inside of the reverse V-shape.

As described above, when the fin groups 18 comprising a pair of fin portions are arranged side by side on the base plate portion, the high flow rate of cooling air 8 may be decelerated and substantially uniformly flown through the fins without using the baffle plate portion and the partition plate portion.

Figure 9:
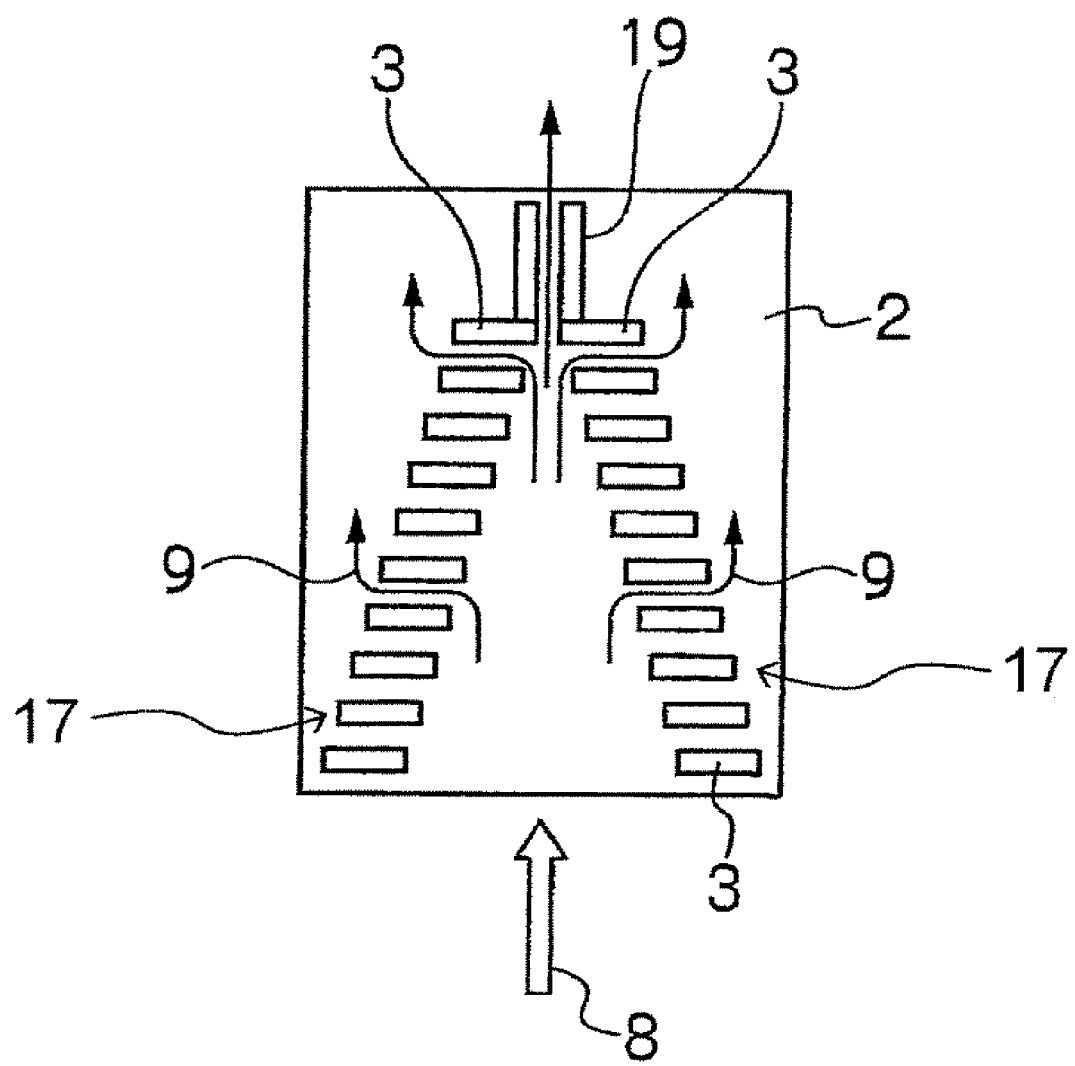
FIG. 9 is a plan view to explain one of the other embodiments of the heat exchanger of the invention.

FIG. 9 is a plan view to explain one of the other embodiments of the heat exchanger of the invention. As depicted in FIG. 9, this embodiment of the heat exchanger is different in the vicinity of the farthest fins of the fin portions from the embodiment of the heat exchanger as described with reference to FIG. 8 (i.e., the fin group 18 comprising a pair of fin portions 17 arranged in a reverse V-shape). More specifically, in this embodiment of the heat exchanger, the farthest fins 3 of the respective fin portions 17 are arranged to be apart with a prescribed clearance from each other, and another pair of fins 19 (i.e., perpendicular to the farthest fins) are placed along the flow direction of the high flow rate of the cooling air 8 at the outlet portion side. Even though the pair of fins 19 are arranged as depicted in FIG. 9, the heat exchanger is designed so as to satisfy the equation, $z=y/2/\sqrt{(a'x/v)}$ as the parameter in the design of the heat exchanger in the same manner as described above, thus the thermal performance thereof is not degraded. More specifically, also in this embodiment of the heat exchanger, the high flow rate of cooling air 8 may be decelerated and substantially uniformly flown as represented by the numeral reference 9 through the fins without using the baffle plate portion and the partition plate portion. In case that the pair of fins 19 are arranged as depicted in FIG. 9, the heat characteristics of the heat exchanger may be stabled even if the flow rate of the cooling air varies.

Figure 10A:
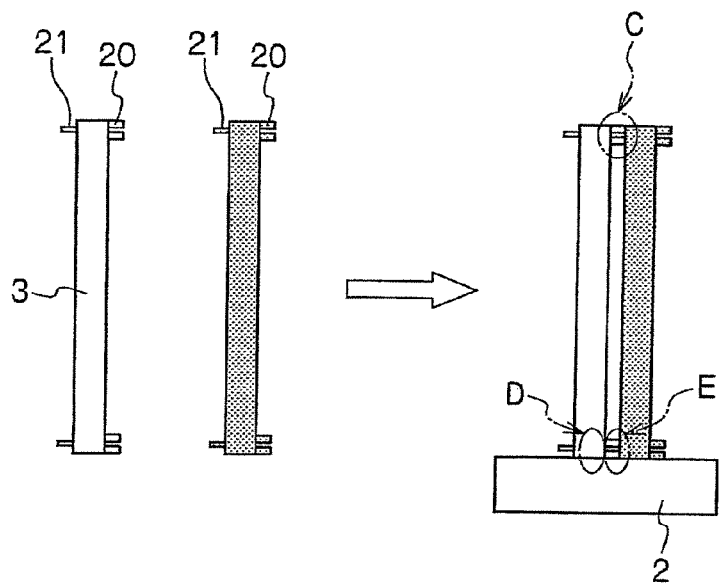
FIG. 10 is a schematic view to explain one embodiment of manufacturing method for the fin portion used in the heat exchanger of the invention.
Figure 10B:
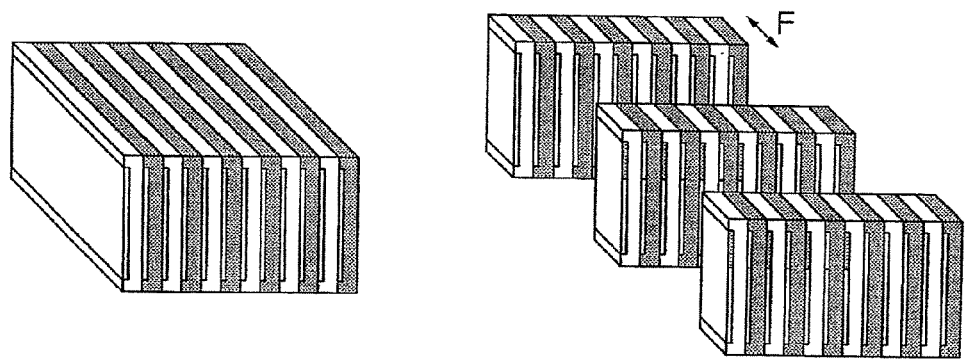

FIG. 10 is a schematic view to explain one embodiment of manufacturing method for the fin portion used in the heat exchanger of the invention. As depicted in FIG. 10(*a*), a plate shaped fin 3 with a protruding portion 21 and a corresponding recessed portion 20 on the surfaces thereof, which function as a fitting structure is formed by an extrusion molding or the like. Then, the protruding portion 21 of one plate shaped fin 3 is inserted into the corresponding recessed portion 20 of the adjacent plate shaped fin 3 so that two plate shaped fins are fitted, as depicted in FIG. 10(*a*), represented by references C and E. The plurality of plate shaped fins are fitted in the same manner as described above. The base portion of the plate shaped fin 3 is thermally connected to the base plate portion 2 so as to be excellent in heat transferability, as depicted in FIG. 10(*a*), represented by reference D. As represented by the reference E, the fitting structure can prevent the solder from moving upward.

In addition to the above-mentioned extrusion molding, the fin may be formed by the (hot or cold) press working of aluminum material. Furthermore, a fin portion may be formed by laminating a plate and a punched metal plate. Pin type fins may be integrally formed on the base portion by (hot or cold) press-working a thick aluminum material.

As depicted in FIG. 10(*a*), the protruding 21 of the fin 3 is fit into the corresponding recessed portion 20 of the adjacent fin 3, and then, as depicted in FIG. 10(*b*), thus fitted fins 3 are cut to form the fin portion having a width as represented by the reference F. The size of the F is within a range from 3 to 20 mm, for example.

For a typical size, there is exemplified that the distance between the adjacent fins is 0.5 mm, the fin thickness is about 1 to 3 mm, the fin length is about 3 to 7 mm, the fin height is about 3 to 60 mm, and [fin thickness]/[distance between the adjacent fins]=1 to 3. The fins may be arranged so as to be slanted with 30 degrees to the flowing direction of the cooling air at the inlet portion of the heat sink, so that the apparent thickness of the fin at the inlet portion of the heat sink may be suppressed to about 30% of the total inlet portion, thus reducing the pressure loss. This is exemplified as an example, and not limited to the scope of the effecting of the invention.

Figure 11A:
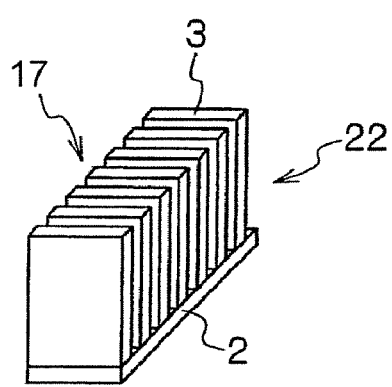
FIG. 11 is a schematic view to explain a state in which the heat exchanger of the invention is applied to a ladle for direct heating.
Figure 11B:
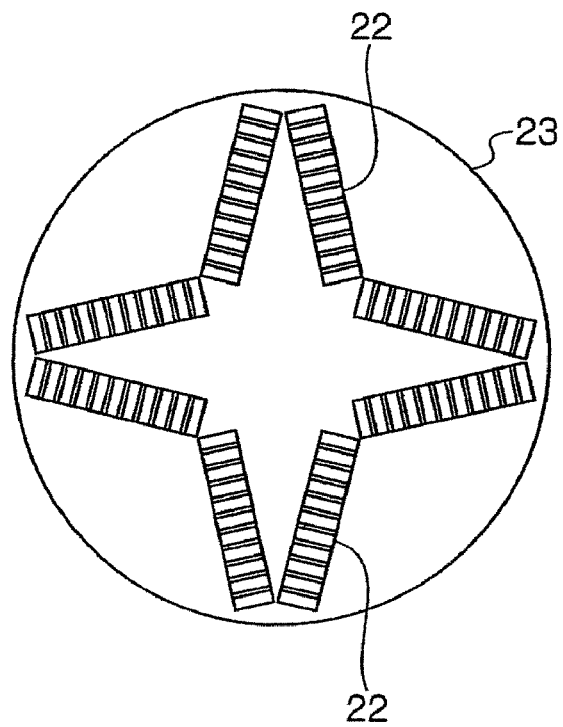

FIG. 11 is a schematic view to explain a state in which the heat exchanger of the invention is applied to a ladle for direct heating. FIG. 11(a) shows a fin portion 22. The fins 3 are arranged with a prescribed distance on the base plate portion 2. FIG. 11(b) shows the state in which the fin portions are arranged on the under side of the ladle for direct heating to perform heat exchange. As depicted in FIG. 11(b), a plurality of pairs of the fin portions 22, each pair of the fin portions 22 arranged in a reverse V-shape, are arranged to form a substantially star shape with the tip of the V thereof located at outer periphery of the ladle. By the above described arrangement of the fin portions under side of the ladle for direct heating, efficiency of the heat exchange is improved by 30 to 50%. Thus, fuel (wood fuel) usage may be reduced to half to ⅔, resulting in CO2 reduction as a part of countermeasures against global warming. The above described heat exchanger may be prepared as a separate component from the ladle, and applied in contact to the ladle, when used.

The heat exchanger of the invention can be applied to both of the air cooling, and water cooling type heat exchanger. More specifically, when applied to the air cooling type heat exchanger, amount of exchanged heat was improved by 10%, and when applied to the water cooling type heat exchanger, the heat transfer was improved by 25%.

For a typical size, there is exemplified that the distance between the adjacent fins is 2 mm, the fin thickness is about 1 to 3 mm, the fin length is about 3 to 7 mm, the fin height is about 3 to 60 mm, and [fin thickness]/[distance between the adjacent fins]=1 to 2. This is exemplified as an example, and not limited to the scope of the effecting of the invention.

According to the invention, the temperature of the heat generating component can be lowered, and the pressure loss of the fluid can be lowered under the condition of the restricted enveloping volume and air flow. More specifically, the heat exchanger excellent in heat dissipating efficiency can be obtained, which cooling capacity is high under the same enveloping volume, and into which cool air is blown even to the downwind without producing temperature difference between windward and downwind. In particular, the heat exchanger remarkably excellent in heat dissipating can be obtained, which base plate portion with the fins arranged thereon is long.

What is claimed is:

1. A heat exchanger, comprising:
a base plate portion with at least one heat generating component thermally connected thereto;
at least one fin portion including a plurality of fins thermally connected to said base plate portion, the plurality of fins being spaced from each other in a row along a direction of flow of a cooling fluid, having a flat front face along the direction of flow, and arranged in parallel at a prescribed non-parallel angle with respect to a longitudinal direction of said base plate portion;
an inlet portion through which the cooling fluid is introduced to each of said at least one fin portion;
a partition portion disposed on a longitudinal side of each fin portion and a baffle plate portion contacting respective inlet and outlet ends of each fin portion, the baffle plate portion and the partition plate portion guiding said cooling fluid so that the cooling fluid is decelerated to be uniformly flown through fins in said at least one fin portion; and
an outlet portion that evacuates the cooling fluid.

2. A heat exchanger, comprising:
at least one fin portion including a plurality of fins spaced from each other in a row along a direction of flow of a cooling fluid;
an inlet portion introducing the cooling fluid to each of said at least one fin portion;
a partition plate disposed on a longitudinal side of each fin portion and a baffle plate contacting respective inlet and outlet ends of each fin portion, the baffle plate and the partition plate guiding said cooling fluid so that the cooling fluid is decelerated to be uniformly flown through fins in said at least one fin portion; and
an outlet portion that evacuates the cooling fluid.

3. A heat exchanger, comprising:
a base plate portion with at least one heat generating component thermally connected thereto;
a fin group with at least two fin portions forming a structure in which a flow rate of cooling fluid is decelerated, each of the fin portions including a plurality of fins thermally connected to said base plate, the plurality of fins being spaced from each other in a row along a direction of flow of a cooling fluid, having a flat front face along the direction of flow, and arranged in parallel at a prescribed non-parallel angle with respect to a longitudinal direction of said base plate portion;
an inlet portion through which the cooling fluid is introduced to each of said at least two fin portions; and
an outlet portion that evacuates the cooling fluid, said fin group being arranged so that the cooling fluid is guided to be decelerated to be uniformly flown through each of the fins in the respective at least two fin portions.

4. The heat exchanger according to claim 3, wherein the fin group is arranged to form a reverse V-shape in which space between the fin portions each includes a plurality of fins placed in parallel becoming narrower from the inlet portion to the outlet portion.

5. The heat exchanger according to claim 3, wherein the fin group is arranged to form a reverse V-shape in which space between the fin portions each includes a plurality of fins placed in parallel becoming narrower from the inlet portion to the outlet portion, and there is included further comprising at least one other pair of fins arranged along the longitudinal direction of the base-plate portion at the outlet portion.

6. The heat exchanger according to claim 1, 2, or 3, wherein said at least one fin portion includes one fin portion, said partition plate portion is arranged on both end portions of said fin portion, and said baffle plate portion is arranged between one side of a fin and an adjacent partition portion.

7. The heat exchanger according to claim 1, 2, or 3, wherein said at least one fin portion includes a plurality of fin portions arranged along a width direction of said base plate portion, and said baffle plate portion is arranged between one side of a respective fin closest to the inlet and the outlet ends and an adjacent partition portion.

8. The heat exchanger according to claim 1 or 2, wherein the cooling fluid introduced through the inlet portion flows along a passage formed between one end portion of the plurality of fins and the partition plate portion, and the cooling fluid is guided by both of the baffle plate portion and the partition plate portion to be decelerated so that the cooling fluid flows through the fins and along a passage formed between other end portions of the plurality of fins and the partition plate portion, and flows out of the outlet portion.

9. The heat exchanger according to claim 1, 2, or 3, wherein a distance between the adjacent fins, a fin length and a flow rate of the cooling fluid through fins are set to minimize a temperature difference between a temperature on a surface of the fin to which a heat of the heat generating component is transferred and a temperature of the cooling fluid at the outlet portion.

10. The heat exchanger according to claim 1, 2, or 3, wherein a speed of the cooling fluid flowing through the fins is reduced so that respective temperature boundary layers of adjacent fins formed by the cooling fluid flowing through the fins are overlapped.

11. The heat exchanger according to claim 1, 2, or 3, wherein a following equation is satisfied:

$$d \leq 9.4\sqrt{(L/v)} \times 3$$

where, d (mm) is a distance between the adjacent fins, L (mm) is a fin length, and v (m/s) is a flow rate of the cooling fluid flowing through fins.

12. The heat exchanger according to claim 1, 2, or 3, wherein a following equation is satisfied:

$$d \leq 9.4\sqrt{(L/v)} \times 2$$

where, d (mm) is a distance between the adjacent fins, L (mm) is a fin length, and v (m/s) is a flow rate of the cooling fluid flowing through fins.

13. The heat exchanger according to claim 1, 2, or 3, wherein a following equation is satisfied:

$$d < 9.4\sqrt{(L/v)}$$

where, d (mm) is a distance between the adjacent fins, L (mm) is a fin length, and v (m/s) is a flow rate of the cooling fluid flowing through fins.

14. The heat exchanger according to claim 1, 2, or 3, wherein a flow volume of the cooling fluid flowing in each fin portion of the plurality of fin portions and/or a flow volume of the cooling fluid flowing through fins is different from each other.

15. The heat exchanger according to claim 1, 2, or 3, wherein said cooling fluid includes a cooling air, and said heat exchanger is a naturally-cooled exchanger.

16. The heat exchanger according to claim 1, 2, or 3, wherein said cooling fluid includes a cooling water, and said heat exchanger is a water-cooled exchanger.

* * * * *